(12) United States Patent
Hannan et al.

(10) Patent No.: US 8,321,830 B2
(45) Date of Patent: Nov. 27, 2012

(54) METHOD AND APPARATUS FOR PROVIDING TIMING INFORMATION WHILE DESIGNING A MULTI-CELL CIRCUIT

(75) Inventors: Pete J. Hannan, Austin, TX (US); Frank P. Skowronski, Austin, TX (US); Jeremy Schreiber, Austin, TX (US); Cory P. Krug, Austin, TX (US); Timothy R. Snyder, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 57 days.

(21) Appl. No.: 12/974,856

(22) Filed: Dec. 21, 2010

(65) Prior Publication Data
US 2012/0159415 A1 Jun. 21, 2012

(51) Int. Cl.
*G06F 15/04* (2006.01)
*G06F 17/50* (2006.01)

(52) U.S. Cl. ........................................ 716/139
(58) Field of Classification Search ............ 716/139
See application file for complete search history.

(56) References Cited

U.S. PATENT DOCUMENTS

| | | | | |
|---|---|---|---|---|
| 5,673,198 A * | 9/1997 | Lawman et al. | | 716/102 |
| 5,903,472 A * | 5/1999 | Barrientos | | 716/113 |
| 6,167,561 A * | 12/2000 | Chen et al. | | 716/102 |
| 6,449,761 B1 * | 9/2002 | Greidinger et al. | | 716/122 |
| 6,470,482 B1 * | 10/2002 | Rostoker et al. | | 716/102 |
| 6,564,365 B1 * | 5/2003 | Argyres | | 716/102 |
| 7,979,831 B1 * | 7/2011 | Srinivasan | | 716/122 |
| 7,992,119 B1 * | 8/2011 | Iotov et al. | | 716/119 |
| 2008/0005713 A1 * | 1/2008 | Singh et al. | | 716/11 |
| 2008/0059931 A1 * | 3/2008 | Peters et al. | | 716/9 |
| 2009/0132981 A1 * | 5/2009 | Alpert et al. | | 716/6 |
| 2009/0254874 A1 * | 10/2009 | Bose | | 716/6 |
| 2010/0229141 A1 * | 9/2010 | Dinter et al. | | 716/9 |

* cited by examiner

*Primary Examiner* — Suresh Memula
(74) *Attorney, Agent, or Firm* — Volpe and Koenig, P.C.

(57) ABSTRACT

A method and apparatus are described for providing timing information to a view placement interactive (VPI) tool user designing a multi-cell circuit. A circuit design comprising a plurality of cells is displayed to the user. Each cell includes a pre-characterized circuit structure. A graphical user interface (GUI) may be used to request a cell placement change, a design connectivity change or a cell type change. The circuit design is modified to implement the requested change, an incremental static timing analysis is performed, and the resulting timing information associated with the requested change is presented on the displayed circuit design. Timing information may be displayed directly on a cell that receives an output from the particular cell, and/or may be displayed adjacent to the particular cell. The timing information may include current and previous frequency slack information associated with each input and output pin of the particular cell.

20 Claims, 9 Drawing Sheets

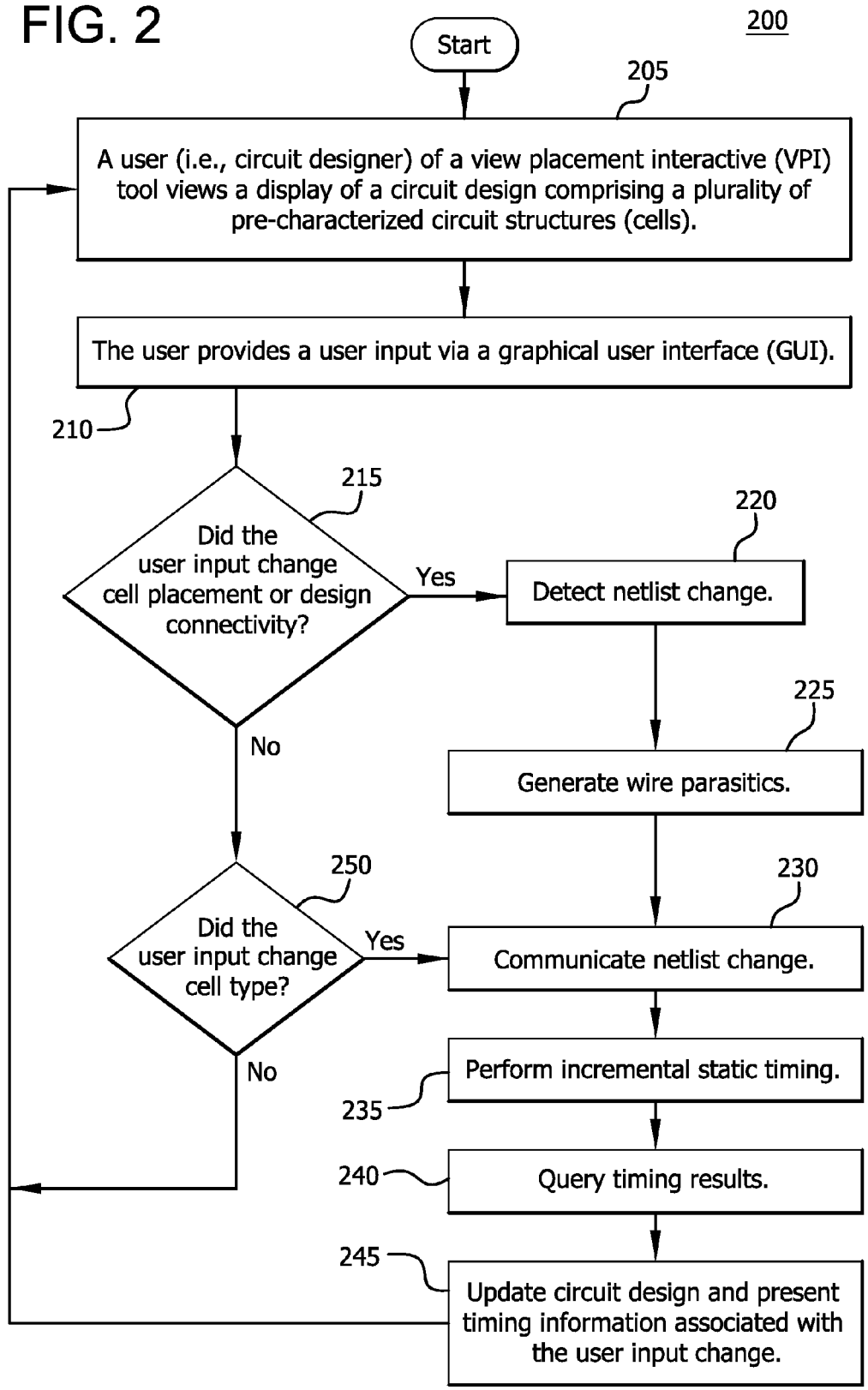

METHOD AND APPARATUS FOR PROVIDING TIMING INFORMATION WHILE DESIGNING A MULTI-CELL CIRCUIT

FIELD OF INVENTION

This application is related to the design of multi-cell circuits (e.g., high performance processors).

BACKGROUND

Semiconductor manufacturers design high performance processors (e.g., CPUs) to compete in a competitive, high-volume market. One of the key marketing features of the processors is their performance-per-watt ratio, which indicates the best performance, (fastest speed and best architecture), at the lowest possible power consumption. Having a favorable performance-per-watt ratio directly affects average selling prices and each manufacturer's profit margin. Thus, a key part of the marketing and capability of each semiconductor manufacturer is to strive for the best performance-per-watt ratio in the designs of these processors.

For a circuit designer who is performing the structured custom design style where cells, (pre-characterized circuit structures selected from a library (e.g., database) of circuit structures (e.g., gates)), are optimally placed and connected, multiple design iterations are used to improve the performance-per-watt ratio. The circuit designer typically uses a graphical user interface (GUI) to change cells to a different cell type or to insert buffer cells. The GUI may also be used to drag and drop the placement of a cell relative to the other cells.

Thus, the circuit designer combines the cells to implement logic functions for a circuit design with the most optimal power and timing. The placement of the cells may be changed, and the location of the cells may be moved around to better optimize the routing of connections between the cells by physically shortening their connections so that capacitance may be reduced, which is one of the primary power consumption considerations.

Currently, a circuit designer must use different tools to perform different circuit design functions. For example, a schematic tool may be used to show how the cells and wires of a circuit are connected, but they do not show placement information, (e.g., a circuit layout having multiple layers that shows the arrangement of the cells). In another example, a separate tool may be used to show the arrangement of the cells, but does not show the connections between the cells. Furthermore, a circuit designer may use a separate static timing analysis tool that performs a batch timing analysis of all cells and wire parasitics based on a netlist of the design, and generates a report of timing paths that indicate how fast, (i.e., the maximum clock frequency), the circuit is going to run.

SUMMARY OF EMBODIMENTS OF THE PRESENT INVENTION

A method and apparatus are described for providing timing information to a view placement interactive (VPI) tool user designing a multi-cell circuit. A circuit design comprising a plurality of cells is displayed to the user. Each cell includes a pre-characterized circuit structure. The user may use a graphical user interface (GUI) to request a cell placement change, a design connectivity change or a cell type change. The circuit design is modified to implement the change requested by the user, an incremental static timing analysis is performed, and the resulting timing information associated with the requested change is presented on the displayed circuit design. Timing information may be displayed directly on a cell that receives an output from the particular cell, and/or may be displayed adjacent to the particular cell. The timing information may include current and previous frequency slack information associated with each input and output pin of the particular cell.

BRIEF DESCRIPTION OF THE DRAWINGS

A more detailed understanding may be had from the following description, given by way of example in conjunction with the accompanying drawings wherein:

FIG. 2 is a flow diagram of a procedure for providing timing information while interactively designing multi-cell circuits in accordance with the present invention;

DETAILED DESCRIPTION

A view placement interactive (VPI) tool is a design cockpit that enables a user (i.e., a circuit designer) to quickly and interactively generate and revise a circuit design of a semiconductor device, such as a central processing unit (CPU), graphics processing unit (GPU), digital signal processor (DSP), and the like. The VPI tool also allows the user to quickly and interactively make a choice to change the cell type and/or change the cell placement, see it visually, and be able to monitor timing. For example, the user of a VPI tool can visualize the source data indicating the connectivity of the circuit, the placement of the circuit and cell type.

The VPI tool is used in accordance with the present invention to incorporate interactive timing features that allow the user to monitor slack while designing a processor. Thus, static timing analysis on a circuit may be analyzed and evaluated interactively and incrementally with each change to determine whether or not there is an improvement in the circuit design.

Embodiments of the present invention combine various ways of visualizing circuit design data with interactive edits to the data and obtaining rapid timing feedback, all in a single tool. This data is presented to the designer in an integrated manner where, instead of performing separate batch processes for making design edits, evaluating the entire circuit, analyzing the entire circuit and then going back and forth in separate environments with separate batch processes, all of these features are combined into one cockpit. Thus, the visualization, the ability to make edits, and the ability to obtain rapid timing feedback, are provided by a single cockpit in an incremental fashion where the designer can make one choice about changing a design, and shortly thereafter, (i.e., within seconds or minutes), receive the feedback needed to determine whether the design change led to an improved performance-per-watt tradeoff. Then, based on this feedback, another design change may be made. Because this inner loop used to optimize the design is significantly faster, circuit designers may evaluate their changes incrementally and interactively, rather than using large time-consuming batch processes.

Figure 1:
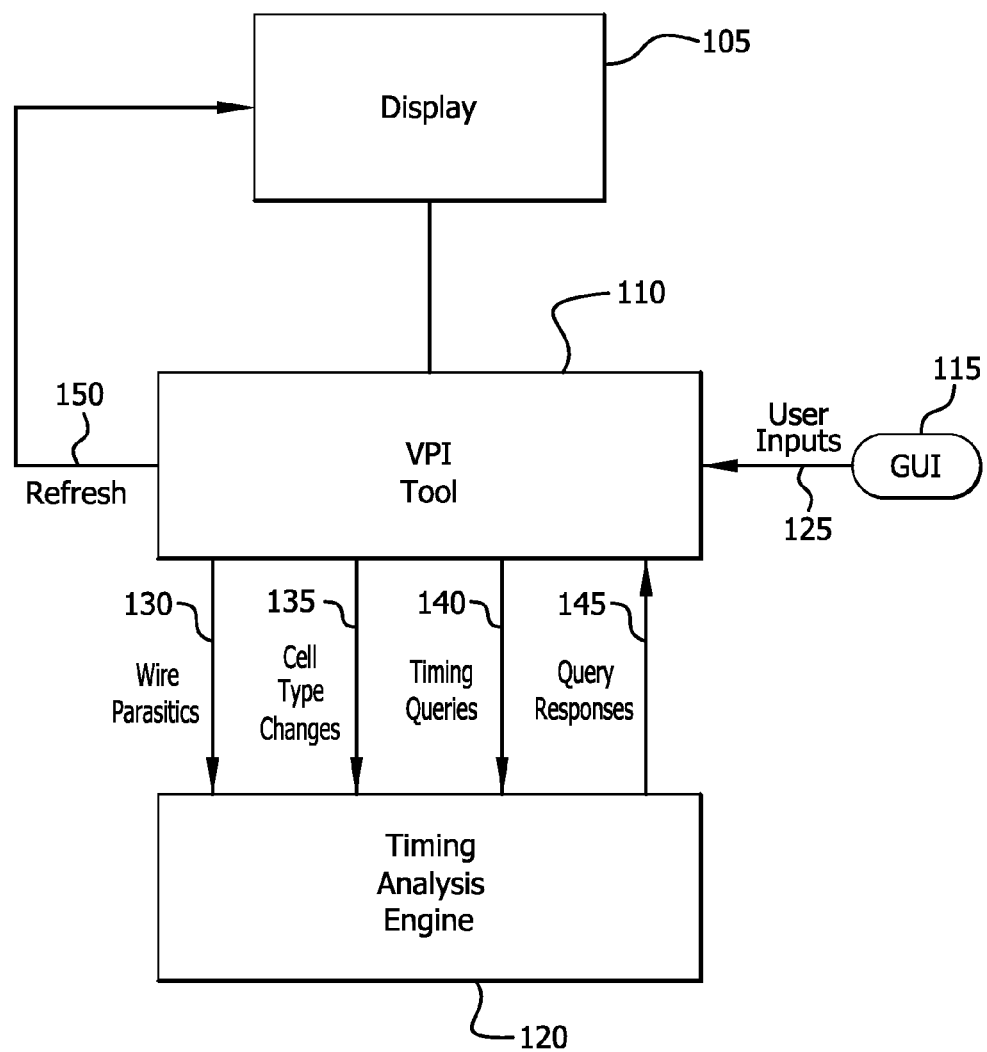
FIG. 1 is a block diagram of an apparatus used by a circuit designer to interactively design a multi-cell circuit in accordance with the present invention.

FIG. 1 is a block diagram of an apparatus 100 used by a circuit designer to interactively design a multi-cell circuit in accordance with the present invention. The apparatus 100 includes a display 105, a VPI tool 110, a GUI 115 and a timing analysis engine 120. The VPI tool 110 receives user inputs 125 from the GUI 115, outputs wire parasitics 130 and/or cell type changes 135 to the timing analysis engine 120, and timing result queries 140 and query responses 145 are exchanged between the VPI tool 110 and the timing analysis engine 120. The VPI tool 110 updates the circuit design and sends a signal 150 to refresh timing information associated with the user input change on the display 105.

Referring to FIG. 1, the display 105 is configured to present a circuit design comprising a plurality of cells to a user. Each cell includes a pre-characterized circuit structure. The GUI 115 is configured to be used to generate a user input associated with a particular cell selected by the user. The VPI tool 110 is configured to receive the user input and determine, based on the user input, whether the user is requesting a cell placement change, a design connectivity change or a cell type change. The timing analysis engine 120 is configured to modify the circuit design presented on the display 105 to implement the change requested by the user, and present timing information associated with the requested change on the display.

The timing information may include a frequency slack value for each input and output pin of the particular cell. Timing information associated with an output pin of the particular cell may be presented directly on a cell that is connected to the output pin, and/or presented adjacent to the particular cell. The timing information may include current frequency slack information associated with each input and output pin of the particular cell, and/or frequency slack information associated with each input and output pin of the particular cell before a cell placement change, a design connectivity change or a cell type change is performed.

When the user of the GUI 115 selects a particular cell displayed on the display 105, (e.g., by clicking on it and dragging it to a new location), the VPI tool 110 detects the user input from the GUI and outputs newly computed wire parasitics 130 based on the length of the wires that interconnect the selected cell with other cells. The wire parasitics 130 are generated based on an estimate of the resistance and capacitance on each of the wires. The VPI tool 110 detects what changed in the netlist (i.e., data associated with all of the cells in the circuit design and how they interconnect with each other), and passes that information (i.e., wire parasitics 130 and/or cell type changes 135) to the timing analysis engine 120. The changes in the netlist are caused by the user inputs, (e.g., circuit design editing commands), which may include cell changes.

The timing analysis engine 120 performs a static timing analysis on the updated design to determine what the clock frequency, (e.g., the toggling rate of a global clock signal connected to the flip-flops in a circuit), and timing slacks should be, and then the VPI tool 110 queries the results from this newly completed analysis. For example, the timing analysis engine 120 may indicate that the timing slack associated with pins on a particular cell changed, and after this timing analysis completes, the VPI tool 110 queries the new timing slacks from the timing analysis engine 120 and sends a refresh signal 150 to the display 105 to visually represent to the user the new timing slack values corresponding to the updated circuit.

FIG. 2 is a flow diagram of a procedure 200 for providing timing information while interactively designing multi-cell circuits. In step 205, a user (i.e., circuit designer) of a VPI tool views a display of a circuit design comprising a plurality of pre-characterized circuit structures (cells). In step 210, the user provides a user input via a GUI.

If it is determined in step 215 that the user input changed cell placement or design connectivity, netlist changes are detected (step 220), wire parasitics are generated (step 225), a netlist change is communicated (step 230), incremental static timing is performed (step 235), timing results are queried (step 240) and the circuit design on the display is updated and timing information associated with the user input change is presented on the display (step 245).

If it is determined in step 215 that the user input did not change cell placement or design connectivity, but it is determined in step 250 that the user input changed a cell type, the netlist change is communicated (step 230), incremental static timing is performed (step 235), timing results are queried (step 240) and the circuit design on the display is updated and timing information associated with the user input change is presented on the display (step 245).

The VPI tool is a software tool that opens up in a similar fashion as Windows, whereby the VPI tool waits for a user to provide some kind of input via the GUI, such as by clicking on a cell instance or pulling down a menu and then making a selection.

One input a user can make is changing cell placement, whereby a cell is moved from its existing location to a new location, along with the wires that connect that cell to other cells. Typically, a collection of cells are within one circuit block of a processor, and multiple blocks are connected together. There may be more than 100 blocks, and each block may have anywhere from 5 to 20,000 cells that are arranged and aligned in a manner used to implement the functions of that block.

Figure 3A:
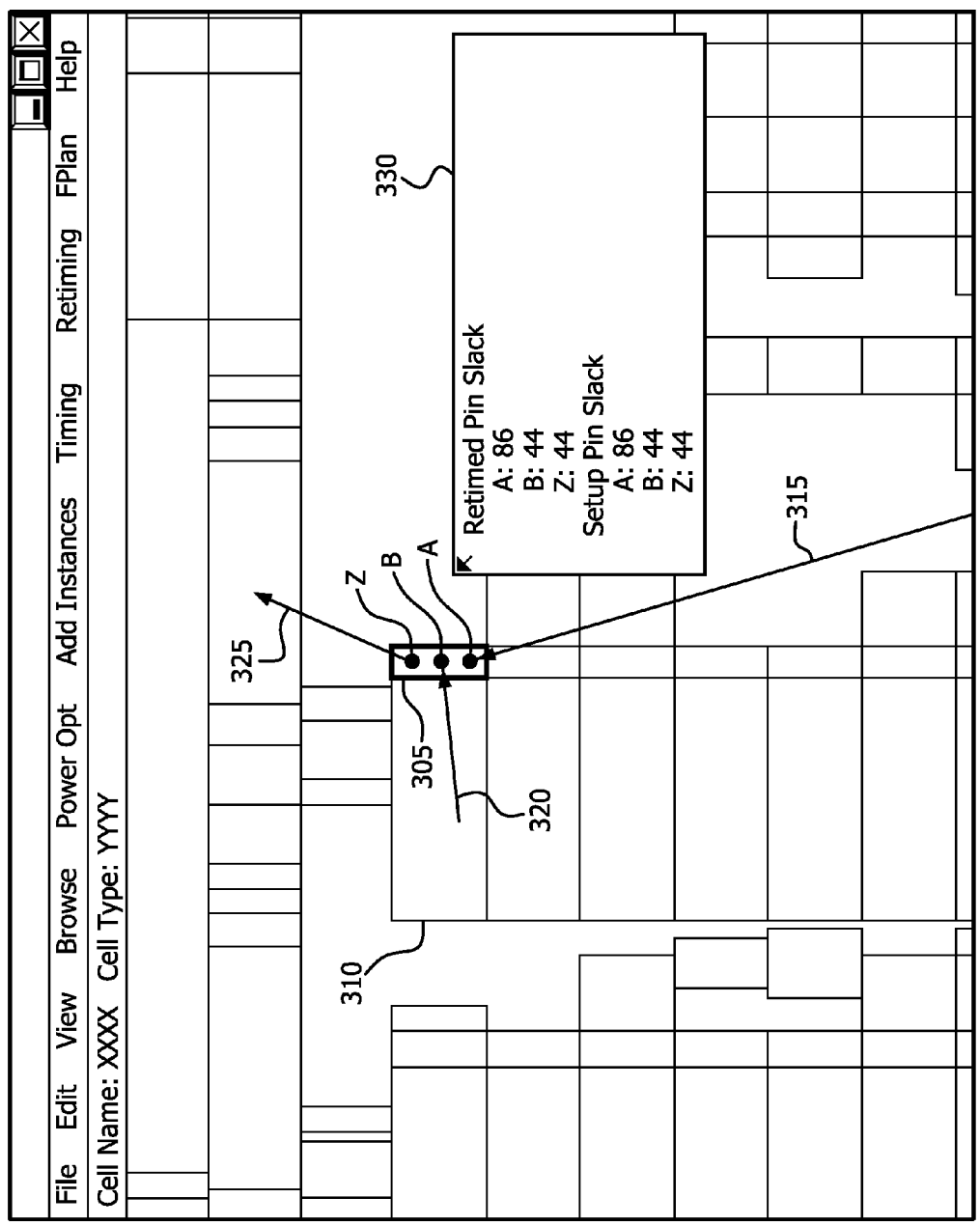
FIG. 3A shows an example of a multi-cell circuit viewed by a circuit designer using the apparatus of FIG. 1 before a selected cell's placement is changed.

FIG. 3A shows an example of a displayed multi-cell circuit viewed by a circuit designer using the apparatus 100 of FIG. 1 before a selected cell's placement is changed. The rectangular-shaped cells of the circuit are typically color-coded and grouped together based on their function (e.g., a 32-bit register or a flip-flop circuit). When a particular cell 305 is selected, it may be highlighted while the other cells (e.g., cell 310) are not. The wires connected to the input pins (A and B) and the output pin (Z) of the cell 305 may be displayed in different colors (e.g., blue for input wires and red for output wires). For example, as shown in FIG. 3A, a first input wire 315 is connected to pin A, a second input wire 320 is connected to pin B and an output wire 325 is connected to pin Z. In accordance with the present invention, a timing analysis window 330 is displayed that indicates the timing slack associated with each of the pins A, B and Z of the selected cell 305.

Timing slack is the amount of time between the requirement to meet a circuit's target clock frequency versus the actual time that was predicted from the timing simulation. Thus, that delta may be referred to as a margin or delta from what's expected versus what the circuit is actually doing. A positive timing slack indicates that there is some positive margin before a design modification/adjustment must be made. A negative timing slack indicates that there is no margin and that the circuit is not meeting its expected requirements and needs to be "fixed". The displayed input wire 320 indicates that there is a logical connection between cell 305 and the cell 310.

Near the top of the display shown in FIG. 3A, the cell name (XXXX) and the cell type (YYYY#) are presented. For example, the cell type of cell 305 may be a NAND gate having a string name that indicates that the NAND gate has two inputs and one output, and has a size of one (1). The cell name describes which unique occurrence of the cell type was placed at that location, (there may be multiple occurrences of the same cell type), while the cell type describes the logical function implemented by the cell. The cell type refers to the logical function (e.g., AND, OR) of the cell, while the cell size refers to the electrical characteristics of drive strength ratio. For example, a NAND size 2 and NAND size 1 have the same logical function, but the NAND size 2 would have roughly twice the drive strength of the NAND size 1. A higher drive strength indicates that the cell may drive a larger capacitive load with a favorably timing delay. Another cell type is a threshold voltage (Vt) cell type. Common Vt types are LVt, RVt, and HVt, corresponding to a low, regular, or high threshold voltage, respectively.

The pop-up timing analysis window 330 shown in FIG. 3A indicates that the timing slack of pin A is 86 picoseconds, and the timing slack of pins B and Z is 44 picoseconds each. The "retimed" pin slack indicates current measurement values, and the "setup" pin slack indicates previous measurement values. The "retimed" pin slack is the result of the updated incremental timing analysis, while the "setup" slack is the original/initial timing result. These timing slack values indicate how much timing slack each pin has with respect to the target frequency the circuit is supposed to run at. Thus, in this particular case, the cell 305 is supposed to run at 3 GHz, but it may only be running at 2 GHz (i.e., a clock period of 500 picoseconds). Thus, if there is 86 picoseconds of timing slack at pin A, there is a fair amount of margin in the timing because it is a positive value. However, if any of the numerical measurements in the timing analysis window 330 are negative, that would indicate a negative slack and that the target frequency is not being met.

Figure 3B:
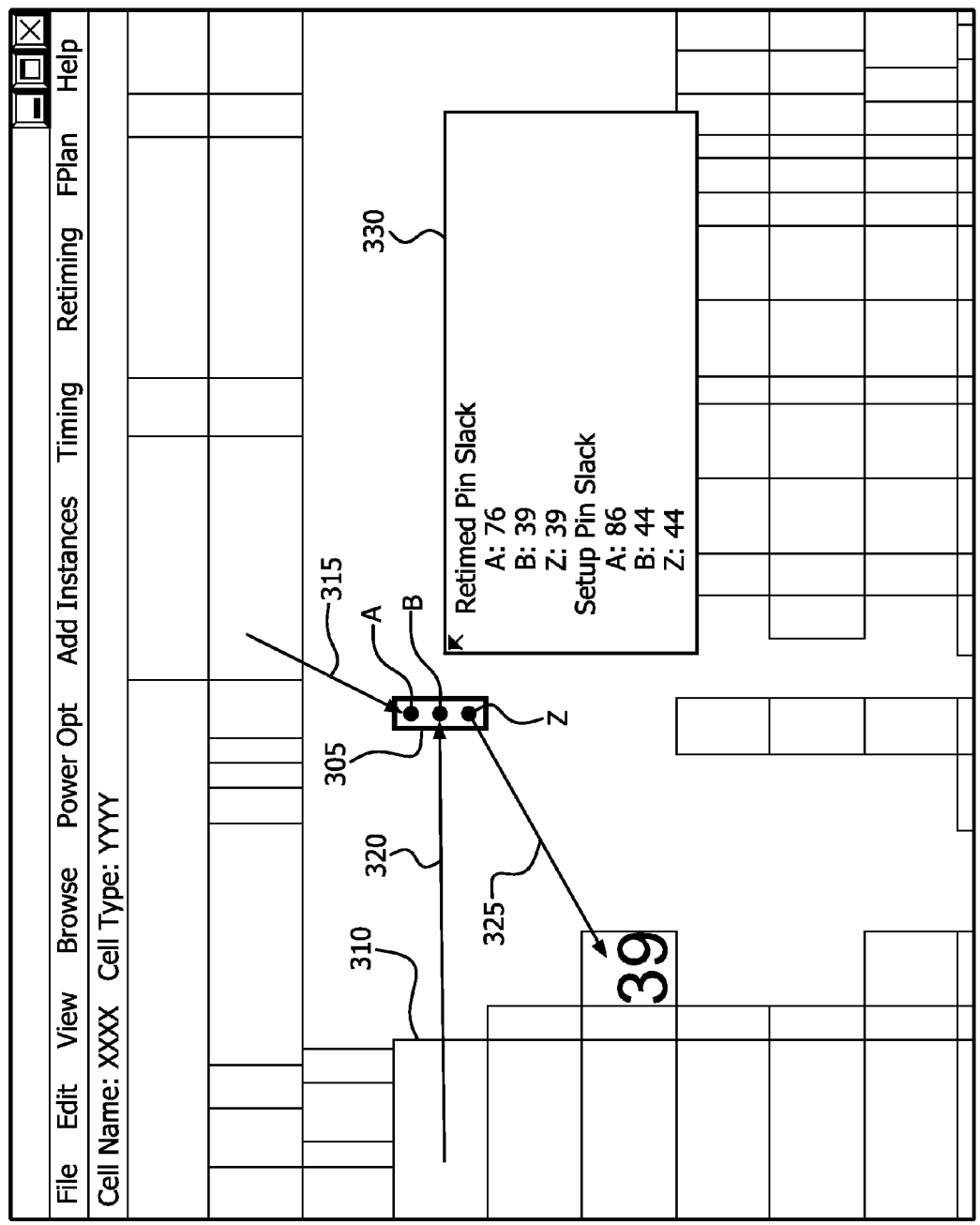
FIG. 3B shows an example of a displayed multi-cell circuit viewed by a circuit designer using the apparatus of FIG. 1 after the placement of the selected cell has been changed.

FIG. 3B shows an example of a displayed multi-cell circuit viewed by a circuit designer using the apparatus 100 of FIG. 1 after the placement of the selected cell 305 has been changed, whereby the wires 315, 320 and 325 have been extended, (i.e., "stretched"), causing the distance for electrons to travel to be greater than before. Thus, the timing analysis window 330 shown in FIG. 3B indicates that the timing slack of pin A was reduced to 76 picoseconds from 86 picoseconds, and the timing slack of pins B and Z were reduced to 39 picoseconds from 44 picoseconds. The clock frequency may therefore be reduced slightly because the cell 305 was moved farther away from its previous location, and there is more distance that has to be traveled by the electrons. Thus, there is less timing slack than before, and there is less of a margin as compared to the desired specifications. As long as the timing slack is positive, there is no immediate concern. However, if the cell 305 is placed even further from its previous position, eventually the timing slack would have a negative value, indicating that cell 305 is failing its frequency target.

Figure 4A:
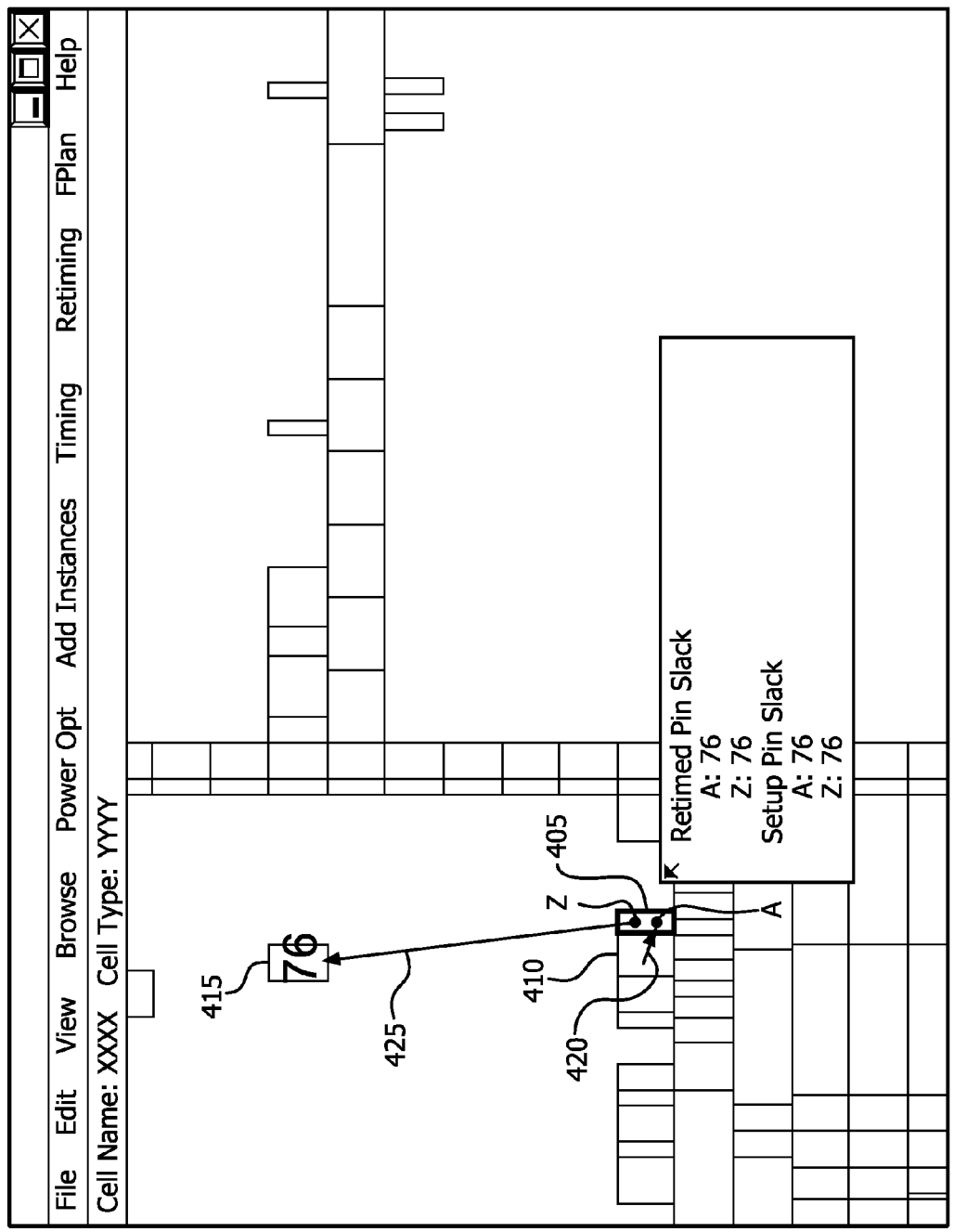
FIG. 4A shows an example of a displayed multi-cell circuit viewed by a circuit designer using the apparatus of FIG. 1 before connectivity of the circuit design is changed.

FIG. 4A shows an example of a displayed multi-cell circuit viewed by a circuit designer using the apparatus 100 of FIG. 1 before connectivity of the circuit design is changed. When a particular cell 405 is selected, it may be highlighted while the other cells (e.g., cells 410 and 415) are not. The wires connected to the input pin (A) and the output pin (Z) of the cell 410 may be displayed in different colors (e.g., blue for input wires and red for output wires). For example, as shown in FIG. 4A, an input wire 420 is connected from cell 410 to pin A of cell 405, and an output wire 425 is connected from pin Z of cell 405 to the cell 415. Note that, in accordance with the present invention, there is a large number "76" displayed over the cell 415 which indicates in picoseconds the current timing slack on the connected receiving pin of cell 415 (connected by a wire 425 to pin Z of cell 405).

Figure 4B:
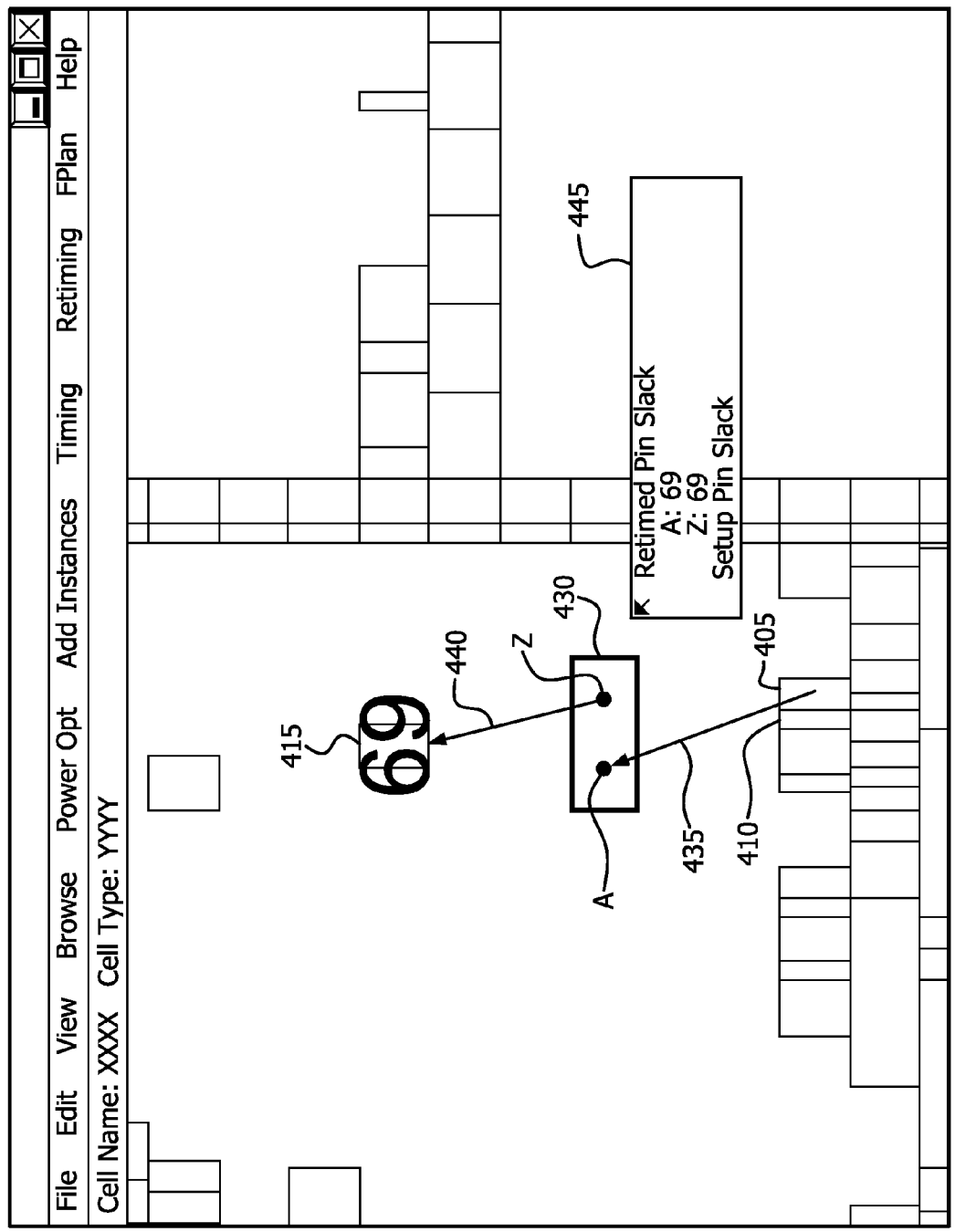
FIG. 4B shows an example of a displayed multi-cell circuit viewed by a circuit designer using the apparatus of FIG. 1 after connectivity of the circuit design is changed.

FIG. 4B shows an example of a displayed multi-cell circuit viewed by a circuit designer using the apparatus 100 of FIG. 1 after connectivity of the circuit design is changed when a new cell 430 having an input pin A and an output pin Z is inserted into the circuit. Upon inserting the new cell 430 between the cells 405 and 415, the cell 430 is highlighted instead of the cell 405, and a new input wire 435 and a new output wire 440 are added in place of the wire 425 of FIG. 4A. In accordance with the present invention, a timing analysis window 445 is displayed that indicates the timing slack associated with each of the pins A and Z of the new cell 430. Thus, as can be seen by comparing FIGS. 4A and 4B, the timing slack was reduced 7 picoseconds by changing from 76 picoseconds to 69 picoseconds due to the addition of the extra cell 430.

Figure 5A:
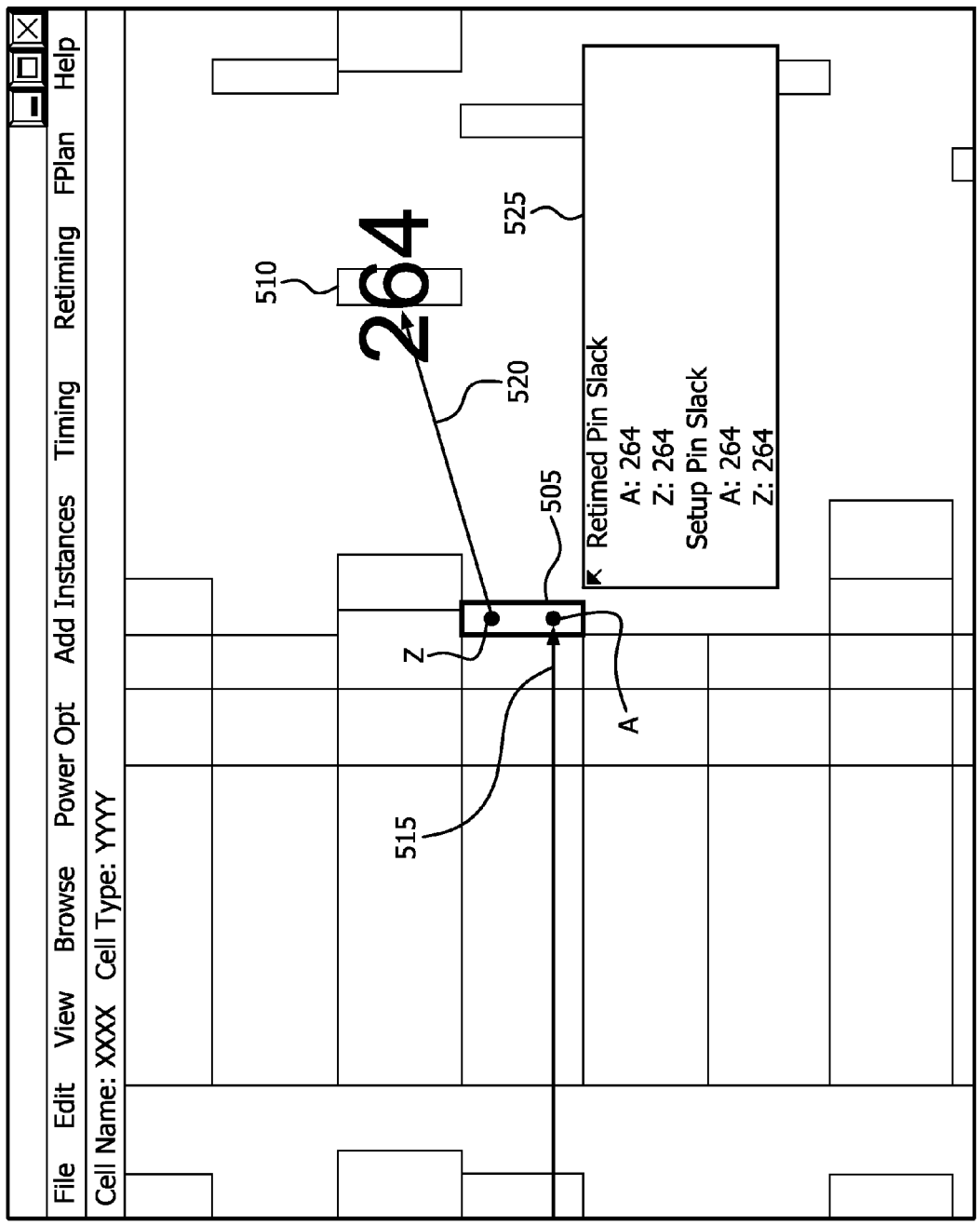
FIG. 5A shows an example of a displayed multi-cell circuit viewed by a circuit designer using the apparatus of FIG. 1 before a cell type is changed.

FIG. 5A shows an example of a displayed multi-cell circuit viewed by a circuit designer using the apparatus 100 of FIG. 1 before a cell type is changed. When a particular cell 505 is selected, it may be highlighted while the other cells (e.g., cell 510) are not. The wires connected to the input pin (A) and the output pin (Z) of the cell 505 may be displayed in different colors (e.g., blue for input wires and red for output wires). For example, as shown in FIG. 5A, an input wire 515 is connected to pin A of cell 505, and an output wire 520 is connected from pin Z of cell 505 to the cell 510. Note that, in accordance with the present invention, there is a large "264" displayed over the cell 510 which indicates the current timing slack in picoseconds.

Figure 5B:
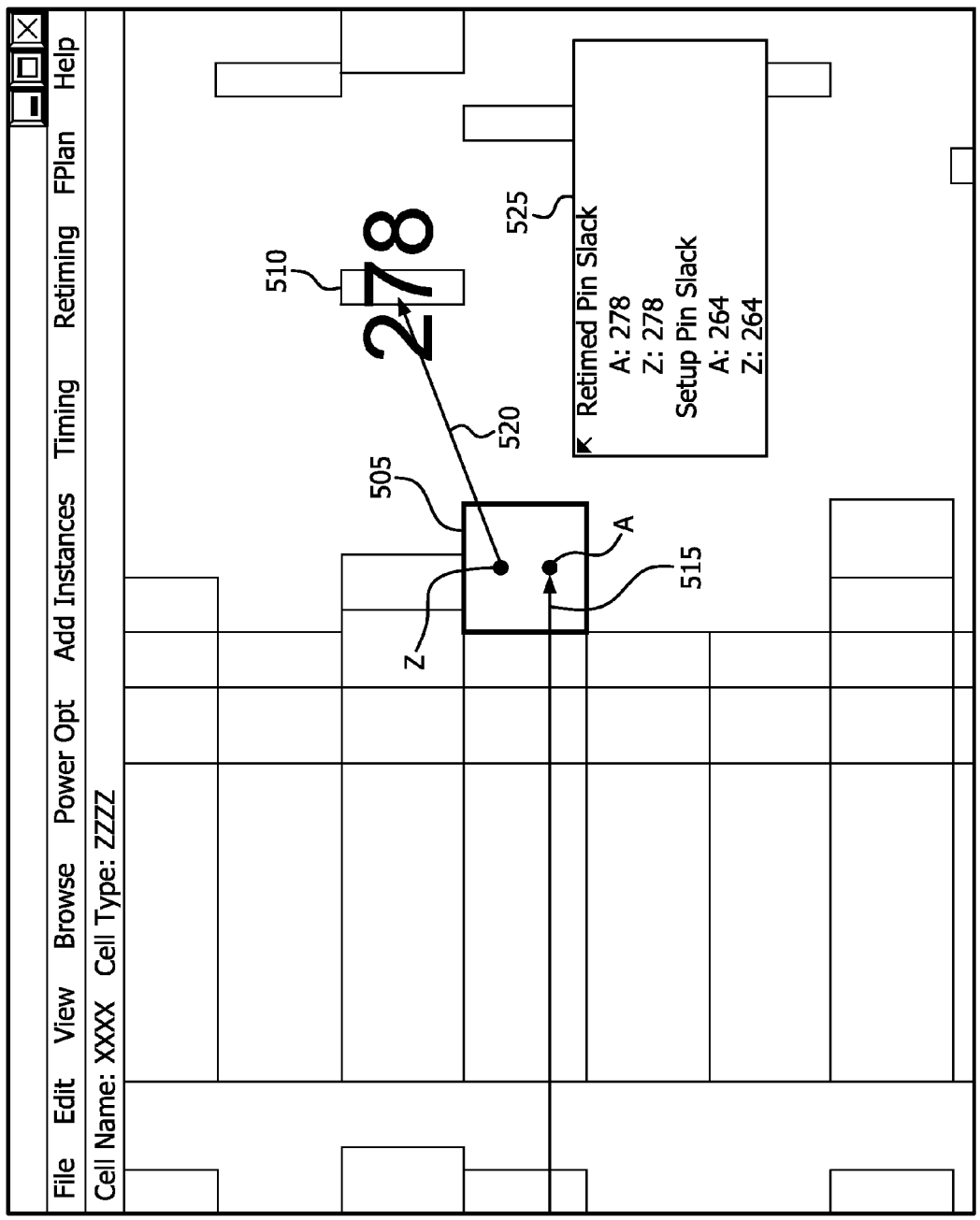
FIG. 5B shows an example of a displayed multi-cell circuit viewed by a circuit designer using the apparatus of FIG. 1 after a cell type is changed.

FIG. 5B shows an example of a displayed multi-cell circuit viewed by a circuit designer using the apparatus 100 of FIG. 1 after the cell type of cell 505 is changed from "YYYY" to "ZZZZ". When the cell type of cell 505 is changed, (e.g., by changing its cell size), the cell placement and the design connectivity remain the same. However, as can be seen by comparing FIGS. 5A and 5B, the timing slack was increased 14 picoseconds by changing from 264 picoseconds to 278 picoseconds due to the enlargement of the cell 505. Typically, when a cell type is changed to a larger size cell type, the frequency is increased but at the expense of additional power consumption. Preferably, it is desirable to select cells as small as possible that can still optimize timing specifications.

Alternatively, a change in cell type may involve changing a cell to a different type of cell having the same function and wired connections, but using different threshold voltages, currents or the like. Irrespective of how the cell type is changed, once the user (i.e., circuit designer) uses a GUI to change a cell's type, the present invention immediately displays the new cell type and after a slight delay (i.e., (a few seconds), the updated timing slack is indicated on the updated display, thus providing an interactive design environment.

The present invention allows a circuit designer to visualize the overall arrangement of the cells, zoom in and look at individual pins on a particular cell, and revise the multi-cell circuit as desired. As the circuit designer makes modifications to the design, changes timing slack, adds connectivity, changes cell placement and cell types, the present invention keeps track of these modifications, recalculates the timing and interactively updates and displays timing slack values in real time. Thus, the circuit designer is able to make tradeoff decisions needed to enhance or reduce timing slack in order to optimize the performance and power consumption of the multi-cell circuit.

Figure 6:
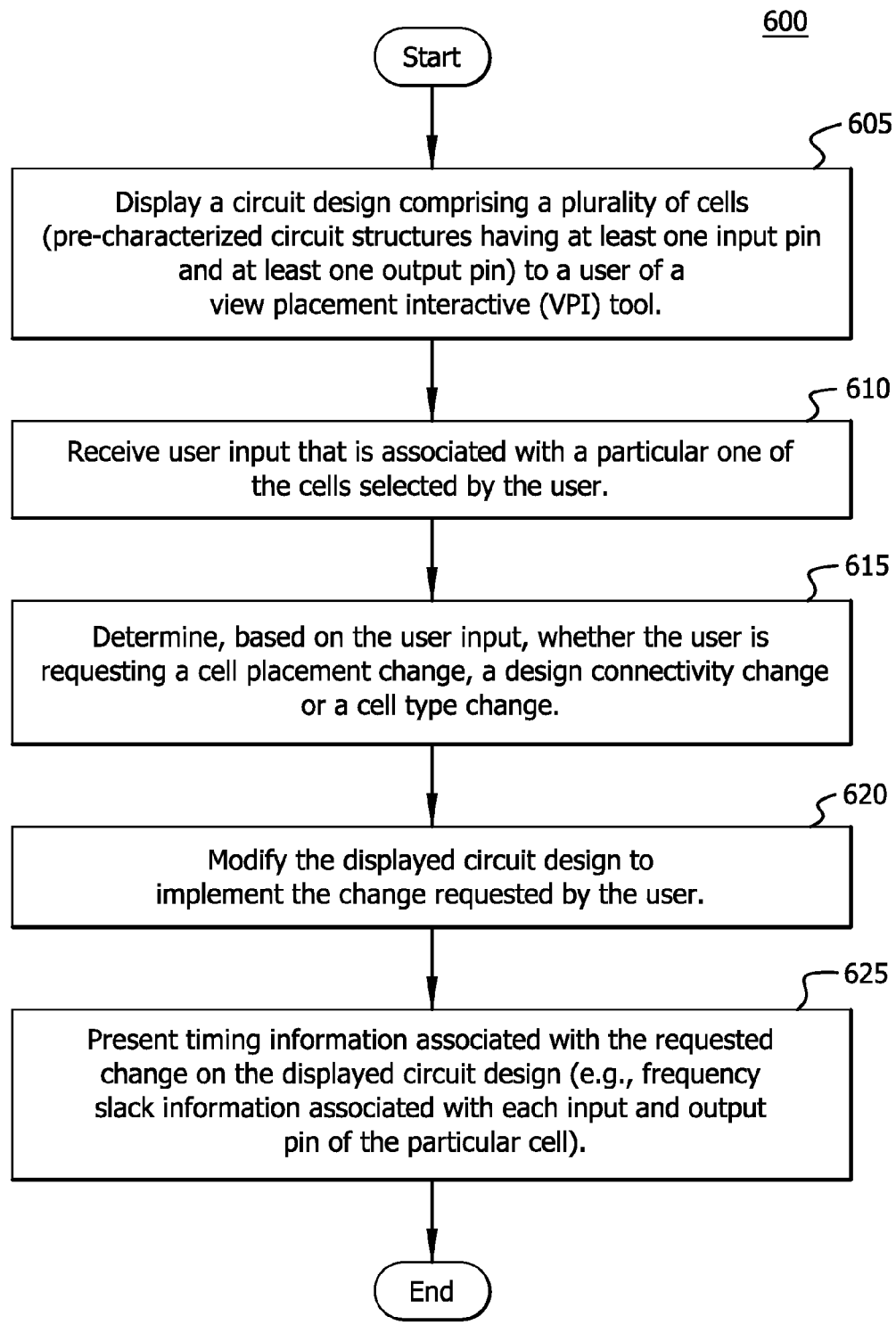
FIG. 6 is a flow diagram of a procedure of interactively providing timing information to a user designing a multi-cell circuit.

FIG. 6 shows a flow diagram of a procedure 200 of interactively providing timing information to a user designing a multi-cell circuit. In step 605, a circuit design comprising a plurality of cells is displayed to the user of a VPI tool. Each cell includes a pre-characterized circuit structure having at least one input pin and at least one output pin. In step 610, a user input is received that is associated with a particular one of the cells selected by the user. In step 615, a determination is made, based on the user input, whether the user is requesting a cell placement change, a design connectivity change or a cell type change. In step 620, the circuit design is modified to implement the change requested by the user. In step 625, timing information associated with the requested change is presented on the displayed circuit design.

A netlist change may be detected if it is determined that a cell placement change is requested by the user. Wire parasitics may be generated if a netlist change is detected or a design connectivity change is requested by the user. A netlist change may be communicated if wire parasitics are generated or a cell type change is requested by the user.

An incremental static timing procedure may be performed in response to receiving the netlist change communication. Updated timing information including a frequency slack value may be determined for each input and output pin of the particular cell in response to performing the incremental static timing procedure. The timing information associated with an output pin of the particular cell may be presented directly on a cell that is connected to the output pin. The timing information may be presented adjacent to the particular cell. The timing information may include current frequency slack information associated with each input and output pin of the particular cell and/or original frequency slack information associated with each input and output pin of the particular cell before a cell placement change, a design connectivity change or a cell type change is performed which modifies the circuit design.

Although features and elements are described above in particular combinations, each feature or element can be used alone without the other features and elements or in various combinations with or without other features and elements. The apparatus described herein may be manufactured using a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data, (e.g., netlists, GDS data, or the like), that may be used to perform a manufacturing process implemented in a semiconductor fabrication facility. The manufacturing process may be adapted to manufacture semiconductor devices (e.g., processors) that embody various aspects of the present invention.

Suitable processors include, by way of example, a general purpose processor, a special purpose processor, a conventional processor, a digital signal processor (DSP), a plurality of microprocessors, a graphics processing unit (GPU), a DSP core, a controller, a microcontroller, application specific integrated circuits (ASICs), field programmable gate arrays (FPGAs), any other type of integrated circuit (IC), and/or a state machine, or combinations thereof.

What is claimed is:

1. A method of providing timing information to a view placement interactive (VPI) tool user designing a multi-cell circuit, the method comprising:
   displaying a circuit design comprising a plurality of cells to the user, each cell including a pre-characterized circuit structure;
   receiving a user input associated with a particular one of the cells selected by the user;
   determining, based on the user input, whether the user is requesting a cell placement change, a design connectivity change or a cell type change, wherein a netlist change is detected if it is determined that a cell placement or design connectivity change is requested by the user;
   modifying the displayed circuit design to implement the change requested by the user; and
   presenting timing information associated with the requested change on the displayed circuit design.

2. The method of claim 1 wherein wire parasitics are generated if a netlist change is detected.

3. The method of claim 2 wherein a netlist change is communicated if wire parasitics are generated or a cell type change is requested by the user.

4. The method of claim 3 wherein an incremental static timing procedure is performed in response to receiving the netlist change communication.

5. The method of claim 4 further comprising:
   determining updated timing information including a frequency slack value for each input and output pin of the particular cell in response to performing the incremental static timing procedure.

6. The method of claim 1 wherein timing information associated with an output pin of the particular cell is presented directly on a cell that is connected to the output pin.

7. The method of claim 1 wherein timing information is presented adjacent to the particular cell.

8. The method of claim 7 wherein the timing information includes current frequency slack information associated with each input and output pin of the particular cell.

9. The method of claim 8 wherein the timing information includes frequency slack information associated with each input and output pin of the particular cell before a cell placement change, a design connectivity change or a cell type change is performed.

10. A method of providing timing information to a view placement interactive (VPI) tool user designing a multi-cell circuit, the method comprising:
    displaying a circuit design comprising a plurality of cells to the user, each cell including a pre-characterized circuit structure having at least one input pin and at least one output pin;
    receiving a user input associated with a particular one of the cells selected by the user;
    modifying the displayed circuit design in response to receiving the user input; and presenting timing information on the displayed circuit design, wherein the timing information is presented by performing at least one of:
  displaying timing information associated with an output pin of the particular cell directly on a cell that is connected to the output pin of the particular cell, or
  displaying timing information associated with each input pin and output pin of the particular cell adjacent to the particular cell.

11. The method of claim 10 wherein the timing information includes frequency slack information.

12. An apparatus for interactively designing a multi-cell circuit, the apparatus comprising:
  a display configured to present a circuit design comprising a plurality of cells to a user, each cell including of a pre-characterized circuit structure;
  a graphical user interface (GUI) used to generate a user input associated with a particular one of the cells selected by the user;
  a view placement interactive (VPI) tool configured to receive the user input and determine, based on the user input, whether the user is requesting a cell placement change, a design connectivity change or a cell type change, wherein a netlist change is detected if it is determined that a cell placement or design connectivity change is requested by the user; and
  a timing analysis engine configured to modify the circuit design presented on the display to implement the change requested by the user, and present timing information associated with the requested change on the display.

13. The apparatus of claim 12 wherein the timing information includes a frequency slack value for each input and output pin of the particular cell.

14. The apparatus of claim 12 wherein timing information associated with an output pin of the particular cell is presented directly on a cell that is connected to the output pin.

15. The apparatus of claim 12 wherein the timing information is presented adjacent to the particular cell.

16. The apparatus of claim 15 wherein the timing information includes current frequency slack information associated with each input and output pin of the particular cell.

17. The apparatus of claim 16 wherein the timing information includes frequency slack information associated with each input and output pin of the particular cell before a cell placement change, a design connectivity change or a cell type change is performed.

18. An apparatus for designing a multi-cell circuit, the apparatus comprising:
  a display configured to present a circuit design comprising a plurality of cells to a user, each cell including a pre-characterized circuit structure having at least one input pin and at least one output pin;
  a view placement interactive (VPI) tool configured to receive a user input associated with a particular one of the cells selected by the user; and
  a timing analysis engine configured to receive wire parasitic or cell type change information from the VPI tool, modify the circuit design presented on the display, and present timing information on the display, wherein the timing information is presented by performing at least one of:
    displaying timing information associated with an output pin of the particular cell directly on a cell that is connected to the output pin of the particular cell, or
    displaying timing information associated with each input pin and output pin of the particular cell adjacent to the particular cell.

19. The apparatus of claim 18 wherein the timing information includes frequency slack information.

20. A circuit design system including a non-transitory computer-readable storage medium containing a set of instructions for interactively providing timing information to a view placement interactive (VPI) tool user designing a multi-cell circuit, the set of instructions comprising:
  a first instruction for displaying a circuit design comprising a plurality of cells to the user, each cell including a pre-characterized circuit structure;
  a second instruction for determining, based on a user input associated with a particular one of the cells selected by the user, whether the user is requesting a cell placement change, a design connectivity change or a cell type change;
  a third instruction for modifying the displayed circuit design to implement the change requested by the user, wherein a netlist change is detected if it is determined that a cell placement or design connectivity change is requested by the user; and
  a fourth instruction for presenting timing information associated with the requested change on the displayed circuit design.

* * * * *